United States Patent [19]
Choi

[11] Patent Number: 5,891,596
[45] Date of Patent: Apr. 6, 1999

[54] METHOD FOR FABRICATING PHASE SHIFTING MASK

[75] Inventor: Yong Kyoo Choi, Chungcheongbuk-do, Rep. of Korea

[73] Assignee: LG Semicon Co., Ltd., Chungcheongbuk-do, Rep. of Korea

[21] Appl. No.: 914,612

[22] Filed: Aug. 21, 1997

[30] Foreign Application Priority Data

Aug. 21, 1996 [KR] Rep. of Korea .................. 1996 34655

[51] Int. Cl.⁶ ..................................................... G03F 9/00
[52] U.S. Cl. .................................................................. 430/5
[58] Field of Search ............................... 430/5, 311, 313, 430/322, 324

[56] References Cited

U.S. PATENT DOCUMENTS

| | | | |
|---|---|---|---|
| 5,358,808 | 10/1994 | Nitayama et al. | 430/5 |
| 5,376,483 | 12/1994 | Rolfson | 430/5 |
| 5,403,682 | 4/1995 | Lin | 430/5 |

OTHER PUBLICATIONS

Imai et al, "KrF excimer laser lithography for gigabit–scale DRAM" Microlithography World, Aug. 1994, pp. 15–19.
Luehrmann et al., "0.35–μm Lithographpy Using Off–Axis Illumination" Microlithography World, Jan. 1994, pp. 15–19.

Primary Examiner—S. Rosasco

[57] ABSTRACT

A method for fabricating a phase shifting mask includes the steps of: forming a light shielding layer on a light transmitting substrate; forming a first mask on the light shielding layer; forming plural openings in the light shielding layer through to the substrate by patterning the light shielding layer using the first mask; forming a second mask layer on the light transmitting substrate and on the first mask layer pattern; patterning the second mask layer to form a second mask that exposes selected ones of the openings in the light shielding layer; and forming a phase shifting region in the light transmitting substrate using the first and second masks. The method prevents the light shielding layer from being damaged by the etching process that forms the phase shifting region, and makes it possible to transfer a pattern accurately, thus achieving a phase shifting mask having high reliability.

13 Claims, 4 Drawing Sheets

METHOD FOR FABRICATING PHASE SHIFTING MASK

FIELD OF THE INVENTION

The present invention relates to a method for fabricating a phase shifting mask, and more particularly, to a method for fabricating a phase shifting mask which simplifies the process steps and improves reliability.

BACKGROUND OF THE INVENTION

In general, a photo mask is used during photolithography, and photolithography is widely adopted in the fabrication of semiconductor devices. The photo mask includes a light transmitting portion and a light shielding portion that combine to expose an underlying surface to a distribution of light. In other words, the photo mask generally includes a light transmitting pattern and a light shielding pattern such that light passing therethrough produces a selective exposure process.

However, as packing density of the pattern increases, diffraction phenomenon of light occurs, which prevents the resolution from being improved. In this regard, a process which improves the resolution using a phase shifting mask has been studied and developed in many fields.

The process using the phase shifting mask includes a light transmitting region which transmits light as it is and a light shifting region which transmits light and shifts it 180° out of phase in order not to reduce the resolution between the light transmitting pattern and the light shielding pattern. In addition, with improvement of the process steps of fabricating the mask, a variety of masks using a phase difference of light have been developed, thereby increasing the limitation of the resolution. For example, there are a RIM type phase shifting mask by Nitayama, and an attenuated phase shifting mask. The RIM type phase shifting mask improves the resolution of a contact hole. The attenuated phase shifting mask reduces the area of the phase shifting mask and is referred to as a half tone phase shifting mask or tπ phase shifting mask. Here t means transmittance.

The conventional method for fabricating a phase shifting mask will be described with reference to the accompanying drawings.

FIG. 1a to FIG. 1h are sectional views of fabricating process steps for a conventional phase shifting mask.

As shown in FIG. 1a, a light shielding layer 11 and a first photoresist 12 are sequentially formed on a light transmitting substrate 10. The light shielding layer 11 is formed of Cr and has a predetermined light transmittance ratio, determined by a predetermined thickness sufficient to be opaque to light.

As shown in FIG. 1b, the first photoresist 12 is patterned by exposure and developing processes to define light shielding regions (lying under the remaining portions of the first photoresist 12).

As shown in FIG. 1c, the light shielding layer 11 is selectively removed by an etching process using the first photoresist 12 as a mask to form openings 3 through which the light transmitting substrate 10 is exposed to light.

As shown in FIG. 1d, the first photoresist 12 on the light shielding layer 11 is removed.

As shown in FIG. 1e, a second photoresist 13 is formed on the overall exposed surface including being formed in the openings 3.

As shown in FIG. 1f, the second photoresist 13 selectively patterned by exposure and developing processes to alternately expose one of the openings 3. The second photoresist 13 has a predetermined alignment margin on the light shielding layer 11.

As shown in FIG. 1g, the light transmitting substrate 10 under the exposed opening 3 is etched to remove enough material so that a phase shifting thickness d remains. The etching process uses the patterned second photoresist 13 as a mask so as to form a phase shifting region 4. The phase shifting thickness d can be expressed by the following formula (1).

$$d = \frac{\lambda}{2(n-1)} \quad (1)$$

Here, $\lambda$ is the length of exposure wavelength, and n is the refractive index of the substrate.

In order to etch the light transmitting substrate 1 to remove an amount of the substrate material so that the phase shifting thickness d remains, an etch back process using reactive ion etching (RIE) process is performed. In this case, $CF_4$ gas is used as the etching gas.

As shown in FIG. 1h, the portions of the second photoresist 13 remaining on the light transmitting substrate 10 and the light shielding layer 11 are finally removed.

The conventional method for fabricating the phase shifting mask has several problems.

First, when the light transmitting substrate 10 is etched to remove enough material so that the phase shifting thickness remains (using the photoresist as a mask by RIE process), a predetermined portion of the light shielding layer 11 is not masked by the photoresist 13 due to the predetermined alignment ratio. This limits the etching ratio between the light shielding layer 11 and the light transmitting substrate 10 because portions of the light shielding layer 11 will be exposed to the etchant. Therefore, because an amount of the light shielding layer is partially and undesirably etched by the $CF_4$ gas used as an etching gas, the light transmittance ratio of the light shielding layer increases. Either the initial thickness of the light shielding layer must be increased so that a minimum thickness remains after the undesired etching or the additional transmittance near the phase shifting region must be tolerated. As a result, it is difficult to accurately pattern the light shielding layer. In addition, reliability of the phase shifting mask is reduced.

When the light shielding layer 11 is partially and undesirably etched, Cr (which forms the light shielding layer) is mixed with the etching gas $CF_4$, thereby resulting in problems that Cr particles are formed on, or deposited in, the phase shifting region of the light transmitting substrate 10. This contamination causes the phase shifting mask to fail to accurately transfer the pattern.

SUMMARY OF THE INVENTION

Accordingly, the present invention is directed to a method for fabricating a phase shifting mask that substantially obviates one or more of the problems due to limitations and disadvantages of the related art.

An object of the present invention is to provide a method for fabricating a phase shifting mask which simplifies the process steps and improves reliability.

To achieve these and other advantages and in accordance with the purpose of the present invention, as embodied and broadly described, a method for fabricating a phase shifting mask according to the present invention includes the steps of: forming a light shielding layer on a light transmitting substrate; forming a first mask on the light shielding layer;

forming a plurality of openings in the light shielding layer through to the substrate by patterning the light shielding layer using the first mask; forming a second mask layer on the light transmitting substrate and on the first mask; patterning the second mask layer to form a second mask that exposes selected ones of the openings in the light shielding layer; and forming a phase shifting region in the light transmitting substrate using the first and second masks.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Reference will now be made in detail to the preferred embodiments of the present invention, examples of which are illustrated in the accompanying drawings.

FIG. 2a to FIG. 2g are sectional views of exemplary fabricating process steps of a phase shifting mask according to the present invention.

Figure 1A:
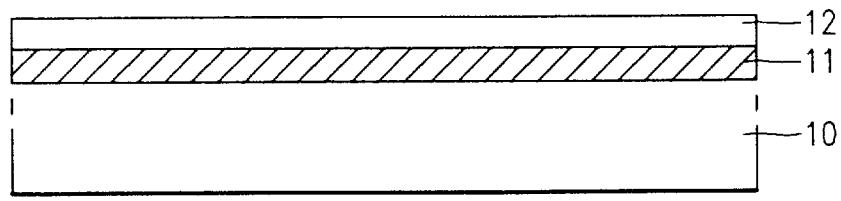
FIG. 1a to FIG. 1h are sectional views of fabricating process steps of a conventional phase shifting mask.
Figure 1B:
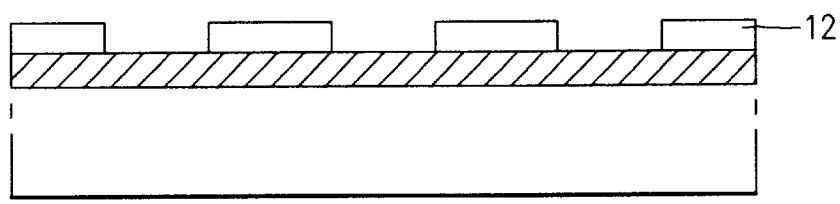
Figure 1C:
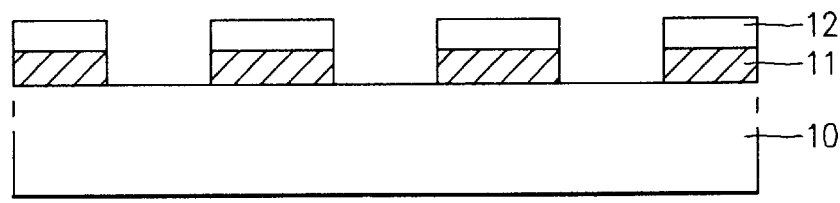
Figure 1D:
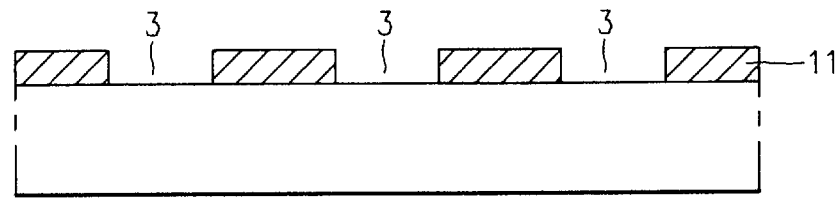
Figure 1E:
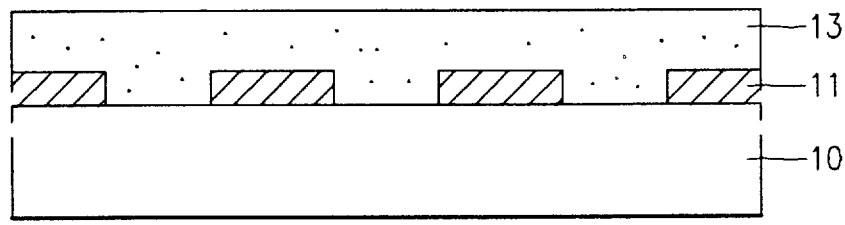
Figure 1F:
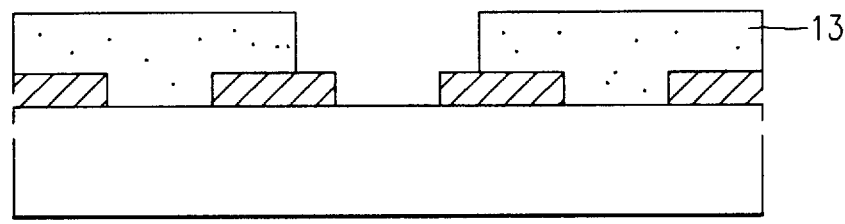
Figure 1G:
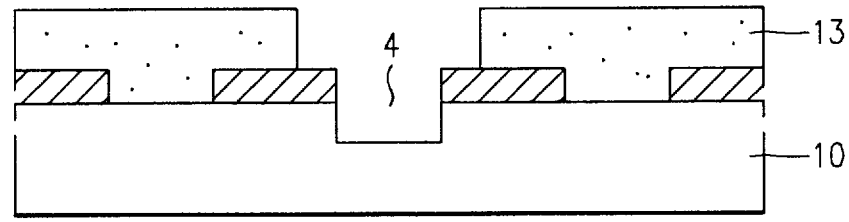
Figure 1H:
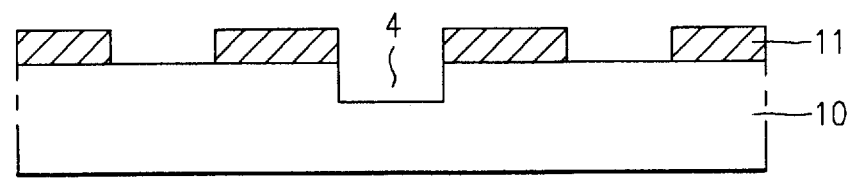
Figure 2A:
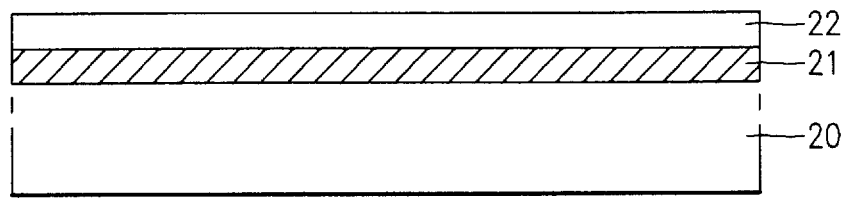
FIG. 2a to FIG. 2g are sectional views of fabricating process steps of a phase shifting mask according to the present invention.

As shown in FIG. 2a, a light shielding layer 21 and a first photoresist 22 are sequentially formed on a light transmitting substrate 20. The light transmitting substrate 20 can be, e.g., either glass or quartz. The light shielding layer 21 is formed of, e.g., either a Cr layer or stacked layers of Cr and $CrO_2$.

Figure 2B:
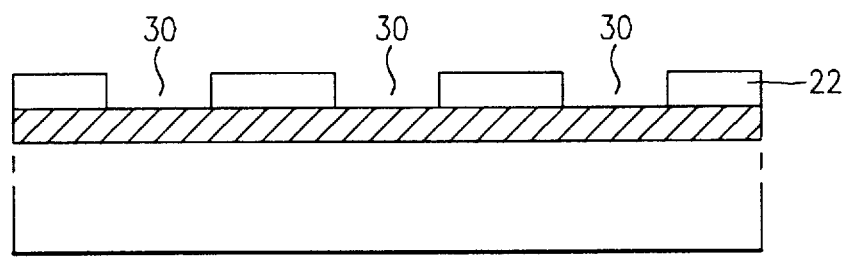

As shown in FIG. 2b, the first photoresist 22 is patterned by exposure and developing processes to define light shielding regions (lying under the remaining portions of the first photoresist 12).

Figure 2C:
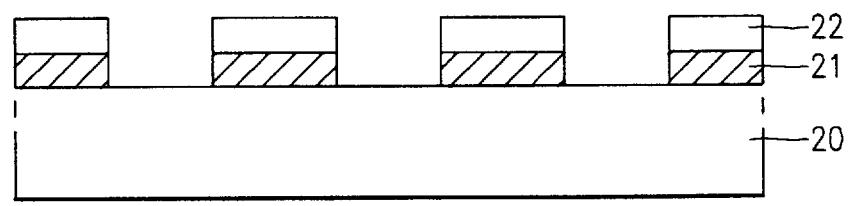

As shown in FIG. 2c, the light shielding layer 21 is selectively removed by an etching process using the patterned first photoresist 22 as a mask. As a result, openings 30 in the light shielding layer 21 are formed through which the light transmitting substrate 10 is exposed. The regions of the light transmitting substrate 10 exposed by the openings 30 in the light shielding layer 21 act as light transmitting regions.

After the formation of the opening regions 30 by the etching process of the light shielding layer 11 but before the second photoresist 23, the first photoresist 22 is cleaned to improve its ability to adhere to the second photoresist 23. This cleaning process uses de-ionized water and an ultrasonic oscillator to remove Cr particles. Then, after the ultrasonic treatment, the cleaning process uses an alkaline treatment to remove various other byproducts, e.g., polymers, that have accumulated. As a result, Cr particles and polymer that occurred due to the etching of the light shielding layer 11 are removed. In addition, after the light shielding layer 11 is etched, the first photoresist is hard baked to harden it against the etchant subsequently used to etch the light transmitting substrate 10.

Figure 2D:
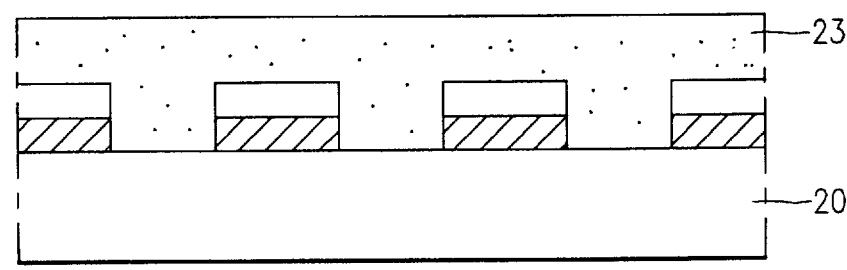

As shown in FIG. 2d, a second photoresist 23 is formed on/against the overall exposed surface, including the first photoresist 22, the edges of the light shielding layer 21 and the exposed portions of the light transmitting substrate 10.

Figure 2E:
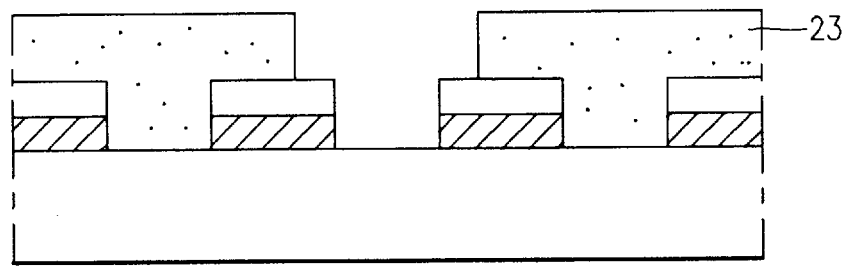

As shown in FIG. 2e, the second photoresist 23 is selectively patterned by exposure and developing processes to re-expose selectively the light transmitting substrate 20 corresponding to one of the openings 30 in the light shielding layer 11. Here, an opening in the second photoresist 23 has a predetermined alignment margin relative to an opening in the first photoresist 22 corresponding to the selected one of the openings 30.

Figure 2F:
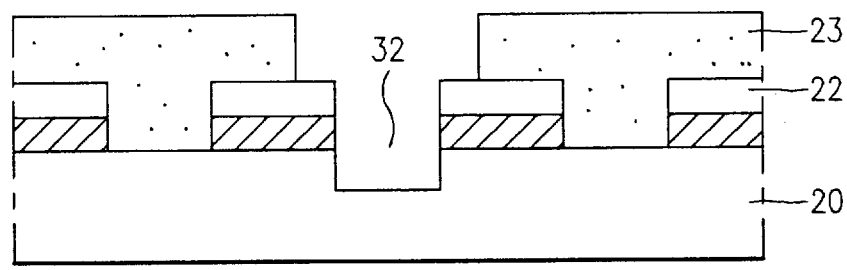

As shown in FIG. 2f, an amount of the light transmitting substrate 20 is etched away so that at a phase shifting thickness d remains thereby forming a phase shifting region 32. The first and second photoresists 22 and 23 act as a mask. Since there is a high etching ratio between the transmitting substrate 20 and the first photoresist 22, it is possible to prevent the light shielding layer 11 from being damaged while the transmitting substrate 22 is etched. The type of etching used is dry etching (or etching with gas) which is anisotropic. Only the upper surfaces are effected by the dry etch, hence it is unnecessary that the edges of the light shielding layer be protected during the etching.

Figure 2G:
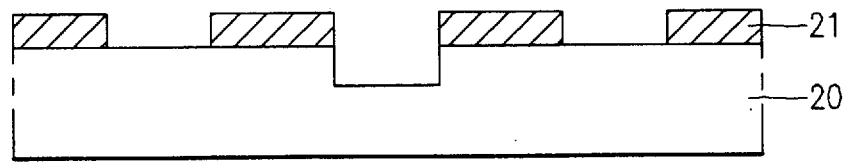

As shown in FIG. 2g, the first and second photoresists 22 and 23 (remaining on the light transmitting substrate 10 and the light shielding layer 11) are finally removed. As a result, the fabricating process steps of the phase shifting mask are completed.

The method for fabricating the phase shifting mask according to the present invention has the following advantages.

First, the first photoresist 22 remains as it is without being removed after etching the light shielding layer 21 and so is used as a mask that protects the light shielding layer 21 when the light transmitting substrate 20 is etched down to the phase shifting thickness. Thus, it is possible to prevent the light shielding layer 21 from being damaged due to the etching process that forms the phase shifting region. As a result, it is possible to transfer an accurate pattern because the amount of contaminating light-shielding-layer particles is reduced. Thus, it is possible to achieve a highly reliable phase shifting mask.

In addition, the first photoresist remains as it is and is used as the etching mask for the phase shifting region (without being removed after the openings in the light shielding layer are formed). This allows the second photoresist to have a high margin of alignment accuracy, i.e., to be less accurately aligned than what was required for the conventional art, during alignment of the second photoresist prior to the formation of the phase shifted region.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating a phase shifting mask comprising the steps of:

forming a light shielding layer on a light transmitting substrate;

forming a first temporary mask on the light shielding layer;

forming a plurality of openings in the light shielding layer through to the substrate using the first temporary mask;

ultrasonically cleaning said light shielding layer and said openings therein;

forming, after said step of ultrasonically cleaning, a second temporary mask, on the first temporary mask, against edges of the light shielding layer, and on the light transmitting substrate, the second temporary mask exposing selected ones of the openings in the light shielding layer; and forming a phase shifting region in the light transmitting substrate using the first and second temporary masks wherein using the first temporary mask in addition to the second temporary mask when forming the phase shifting region reduces by-product contamination otherwise caused by etching the light transmitting substrate.

2. The method for fabricating a phase shifting mask as claimed in claim 1, wherein the light transmitting substrate includes either glass or quartz.

3. The method for fabricating a phase shifting mask as claimed in claim 2, wherein the light shielding layer includes Cr.

4. The method for fabricating a phase shifting mask as claimed in claim 1, wherein the light shielding layer includes stacked layers of Cr and $CrO_2$.

5. A method for fabricating a phase shifting mask comprising:

forming a light shielding layer on a light transmitting substrate;

forming a first temporary mask on the light shielding layer;

forming a plurality of openings in the light shielding layer through to the substrate using the first temporary mask;

performing an alkaline treatment on said light shielding layer and said openings to remove polymer contamination caused by patterning the light shielding layer;

forming a second temporary mask, on the first temporary mask, against edges of the light shielding layer, and on the light transmitting substrate, the second temporary mask exposing selected ones of the openings in the light shielding layer; and forming a phase shifting region in the light transmitting substrate using the first and second temporary masks wherein using the first temporary mask in addition to the second temporary mask when forming the phase shifting region reduces by-product contamination otherwise caused by etching the light transmitting substrate.

6. The method for fabricating a phase shifting mask as claimed in claim 1, further comprising the step of hard baking the first temporary mask prior to the step of forming the second temporary mask.

7. The method for fabricating a phase shifting mask as claimed in claim 1, further comprising the step of performing an alkaline treatment to remove polymer contamination caused by patterning the light shielding layer, after the step of ultrasonic cleaning but prior to the step of forming the second temporary mask.

8. The method for fabricating a phase shifting mask as claimed in claim 7, further comprising the step of hard baking the first temporary mask, after the step of performing an alkaline treatment but prior to the step of forming the second temporary mask.

9. The method for fabricating a phase shifting mask as claimed in claim 1, further comprising the step of removing the first and second temporary masks leaving the light shielding layer and the light transmitting substrate.

10. The method for fabricating a phase shifting mask as claimed in claim 1, wherein said ultrasonic cleaning takes place in a medium of deoinized water.

11. A method for fabricating a phase shifting mask comprising the steps of:

forming a light shielding layer on a light transmitting substrate;

forming a first temporary mask layer on the light shielding layer;

forming a plurality of openings in the light shielding layer through to the substrate by patterning the light shielding layer using the first temporary mask layer;

ultrasonically cleaning said light shielding layer and said openings therein in a medium of deoinized water;

forming a second temporary mask layer on the light transmitting substrate and on the first temporary mask layer;

patterning the second temporary mask layer to form a second temporary mask that exposes selected ones of the openings in the light shielding layer; and forming a phase shifting region in the light transmitting substrate using the first and second temporary masks wherein using the first temporary mask layer in addition to the second temporary mask layer when forming the phase shifting region reduces an alignment accuracy that would otherwise be required for the step of patterning the second temporary mask layer.

12. The method for fabricating a phase shifting mask as claimed in claim 11, further comprising the step of removing the first and second temporary masks leaving the light shielding layer and the light transmitting substrate.

13. The method for fabricating a phase shifting mask as claimed in claim 11, wherein the light shielding layer includes stacked layers of Cr and $CrO_2$.

* * * * *